United States Patent [19]

Aoki

[11] Patent Number: 5,493,536

[45] Date of Patent: Feb. 20, 1996

[54] DUAL-PORT RANDOM ACCESS MEMORY HAVING MEMORY CELL CONTROLLED BY WRITE DATA LINES AND READ ENABLE LINE

[75] Inventor: Yasushi Aoki, Tokyo, Japan

[73] Assignee: NEC Corporation, Tokyo, Japan

[21] Appl. No.: 289,255

[22] Filed: Aug. 11, 1994

[30] Foreign Application Priority Data

Aug. 11, 1993 [JP] Japan .................................. 5-220552

[51] Int. Cl.[6] .................................................. G11C 8/00
[52] U.S. Cl. ............................ 365/230.05; 365/189.04; 365/154; 365/203; 365/189.08; 365/190
[58] Field of Search ......................... 365/230.05, 189.04, 365/154, 203, 230.03, 227, 189.08, 190

[56] References Cited

U.S. PATENT DOCUMENTS

| | | | |
|---|---|---|---|
| 4,933,899 | 6/1990 | Gibbs | 365/177 |
| 5,216,636 | 6/1993 | Runaldue | 365/230.05 |
| 5,307,322 | 4/1994 | Usami et al. | 365/230.05 |

*Primary Examiner*—David C. Nelms
*Assistant Examiner*—Andrew Q. Tran
*Attorney, Agent, or Firm*—Sughrue, Mion, Zinn, Macpeak & Seas

[57] ABSTRACT

A semiconductor memory circuit contains an array of memory cells, each of which contains a data latch formed of cross-coupled two inverters. First and second gate elements connected in series are placed between an output end of the latch and a reference point. Third and fourth gate elements connected in series are placed between the other output end and the reference point. Fifth, sixth and seventh gate elements connected in series are placed between the reference point and a read data line. During a write operation, while keeping the first and fourth gate elements and one of the second and third gate elements closed, a data to be stored is written in the latch through one of the pair of write data lines. During a read operation, while keeping the sixth and seventh gate elements closed, a stored data in the latch is read out through the read data line. Read and write operations can be performed without affecting the unselected memory cells, which reduces power dissipation during write and read operations.

10 Claims, 5 Drawing Sheets

5,493,536

DUAL-PORT RANDOM ACCESS MEMORY HAVING MEMORY CELL CONTROLLED BY WRITE DATA LINES AND READ ENABLE LINE

BACKGROUND OF THE INVENTION

1. Field of the Invention

The present invention relates to a semiconductor memory circuit with an improved memory cell structure.

2. Description of the Prior Art

A conventional dual-port Random Access Memory (RAM), having an exclusive port for a reading operation and another for a writing operation, and a memory cell thereof are shown in FIGS. 2 and 1, respectively.

As shown in FIG. 1, a dual-port memory cell 53 has a pair of word lines AW and BW, a first pair of data lines AD and ADB and a second pair of data lines BD and BDB. A single-bit memory cell 53 is deposited at an intersection of the lines AW, BW, AD, ADB, BD and BDB.

The memory cell 53 contains a pair of inverters 38 and 39 for data latching, and four N-channel MOS transistors 11, 12, 13 and 14 as gate elements for controlling data input and output operations to the latch.

The input end of the inverter 38 and the output end of the inverter 39 are connected in common to a connection point 40 and the input end of the inverter 39 and the output end of the inverter 38 are connected in common to a connection point 41, which constitute a well-known data latch circuit.

The gate element 11 is placed between the connection point 40 and the data line AD. The word line AW is connected to the control terminal of the gate element 11. The gate element 13 is placed between the connection point 40 and the data line BD. The word line BW is connected to the control terminal of the gate element 13.

The gate element 12 is placed between the connection point 41 and the data line ADB. The word line AW is connected to the control terminal of the gate element 12. The gate element 14 is placed between the connection point 41 and the data line BDB. The word line BW is connected to the control terminal of the gate element 14.

The entire architecture of the conventional dual-port RAM is shown in FIG. 2. In this RAM, $N_x$ memory cells 53 are arranged horizontally and $N_y$ memory cells 53 are arranged vertically, resulting in an $N_x \times N_y$ matrix array 200 of the cells 53. First to nth matrix arrays 200 of the memory cells 53 are aligned horizontally. Therefore, this RAM can store information of n bits x ($N_x \times N_y$) words.

First to nth data input/output sections 201 are provided for the respective memory cell arrays 200. Each of the data input/output sections 201 contains a column selector 54, a data-writing section 55 and a data-reading section 56.

A row decoder 51 receives an address signal and generates a row select signal to output it to the respective memory cell arrays 200. The row to be read out or to be written in is selected by the row select signal during a reading or writing operation.

A column decoder 52 receives the address signal and generates a column select signal to output it to the respective column selectors 54 and the respective data-writing sections 55 of the data input/output sections 201. One of the columns to be read out or to be written in is selected by the column select signal during a reading or writing operation.

In a write operation, the data-writing section 55 receives a data value to be stored and sends it to the memory cells 53 contained in the selected column.

In a read operation, the column selector 54 receives the data stored in the memory cells 53 of the row selected to be read out, and selects one of the columns containing desired data therefrom according to the column select signal.

The data reading section 56 outputs the data received from column selector 54.

The data lines AD of all the memory cells 53 contained in each column of the memory cell matrix 200 are connected in common and the data lines ADB thereof are connected in common. Similarly, the data lines BD of all the memory cells 53 contained in each column of the memory cell matrix 200 are connected in common and the data lines BDB thereof are connected in common.

The word lines AW of all the memory cells 53 contained in each row of the memory cell matrix 200 are connected in common and the word lines BW thereof are connected in common.

The row select signal outputted from the row decoder 51 is inputted to the common-connected word lines AW and BW of all the memory cells 53, respectively.

The output of the data-writing section 55 is inputted to the common-connected data lines AD and ADB of all the memory cells 53 and to the common-connected data lines BD and BDB thereof, respectively.

The outputs of the memory cells 53 are inputted to the column-selector 54 through the common-connected data lines AD and ADB and through the common-connected data lines BD and BDB, respectively.

During a write operation, for example, when the word line AW of the memory cell 53 selected is driven to a high logic state 1, then the gate elements 11 and 12 close. The data value to be stored is transferred to the data lines AD, ADB BD and BDB of the selected memory cell 53 through the data writing section 55, respectively.

Next, the first pair of the data lines AD and ADB are driven to opposite logic states, respectively. That is, the data line AD is a high logic state 1 and the data line ADB is a low logic state 0, or the data line ADB is a high logic state 1 and the data line AD is a low logic state 0. In the former case, the data is stored in the inverter 38 through the gate element 11. In the latter case, the data is stored in the inverter 39 through the gate element 12.

During a read operation, for example, he word line AW of a selected memory cell 53 is driven to a low logic state 0, and the data lines AD and ADB are precharged to high logic states 1, respectively.

Next, the word line AW is changed to a high logic state 1 to close gate elements 11 and 12, and then either of the data lines AD and ADB is changed to a low logic state 0 according to the stored data value in the inverter 38 or 39.

This change in logic state of the data line AD or ADB is transferred through the column selector 54 to the data-reading section 56 to be read out.

The precharge of the data lines AD and ADB during a read operation is carried out to avoid false data writing. If the precharge step is not performed, when the word line AW is changed to a high logic state 1 under the condition that one of the data lines AD and ADB is in a high logic state 1 and the other is a false low logic state 0, a data (transferred through data line AD or ADB) is erroneously stored.

Write and read operations for the other word line BW and the other data lines BD and BDB are similar to the operations described above.

The conventional dual-port RAM has the following problems:

First, when a given data value is stored in the conventional RAM, it is stored in just one of the $N_x \times N_y$ memory cells 53 arranged in the matrix array 200, but the other cells 53 thereof must maintain their data values.

However, with the $N_x$ memory cells 53 contained in one row selected by the row decoder 51, as described above, the word line AW or BW of the same selected row is driven to a high logic state 1 during a write operation. Therefore, to prevent the given data value from being stored in the memory cells 53 contained in the columns not selected by the column decoder 52, the same operation as the read operation is required during a write operation.

In detail, for example, the word line AW or BW of the selected memory cell 53 is driven to a low logic state 0, and the pair of the data lines AD and ADB or the pair of the data lines BD and BDB are precharged to high logic states 1, respectively. Thereafter, the word line AW or BW is changed to a high logic state 1 to close gate elements 11 and 12, or gate elements 13 and 14, respectively and then either of the pair of the data lines AD and ADB or the pair of the data lines BD and BDB is changed to a low logic state 0 due to the data value stored in inverter 38 or 39. During this period of time, the given data to be stored is transferred to the memory cell 53 selected by the row decoder 51 and the column decoder 52 to be stored therein.

Accordingly, even if only one of the $N_x$ pairs of the data lines AD and ADB or those of the data lines BD and BDB is sued for the write operation, read operations are required for the remaining ($N_x-1$) pairs thereof, respectively. As a result, the power dissipation for these remaining pairs is wasted.

Second, when a single data value stored in the conventional RAM is read out, the desired data value stored in a selected one of the $N_x \times N_y$ memory cells 53 is sufficient to be read out and the data values stored in the remaining cells 53 are not required to be read out.

However, with the $N_x$ memory cells 53 contained in one row selected by the row decoder 51, as described above, the word line AW or BW of the same selected row is driven to a high logic state 1 during a read operation. Therefore, the remaining memory cells 53 not selected by the column decoder 52 are subjected to the read operations.

In detail, for example, the word line AW or BW of the selected memory cell 53 is driven to a low logic state 0, and the $N_x$ pairs of the data lines AD and ADB or the $N_x$ pairs of the data lines BD and BDB are precharged to high logic states 1, respectively. Thereafter, the word line AW or BW is changed to a high logic state 1 to close gate elements 11 and 12 or gate elements 13 and 14, respectively and then either of the pair of the data lines AD and ADB or the pair of the data lines BD and BDB is changed to a low logic state 0 according to the data value stored in inverter 38 or 39.

Accordingly, even if only one of the $N_x$ pairs of the data lines AD and ADB or those of the data lines BD and BDB is used for the read operation, the same read operations are required for the remaining ($N_x-1$) pairs thereof, respectively. As a result, the power dissipation for these remaining pairs is wasted.

SUMMARY OF THE INVENTION

Accordingly, it is an object of the present invention to provide a semiconductor memory circuit in which power dissipation can be reduced during write and read operations compared with the conventional one.

A semiconductor memory circuit according to a present invention has an array of memory cells, each of the memory cells containing a latch circuit formed of two inverters.

First and second gate elements connected in series are placed between one output end of the latch circuit and a reference point. Third and fourth gate elements connected in series are placed between the other output of the latch circuit and the reference point. Fifth, sixth and seventh gate elements connected in series are placed between the reference point and a read data line.

The fifth gate element is driven to open or closed according to a data value stored in the latch circuit through one of the first and second connection points. The sixth gate element is driven to open or closed in response to a read data enable signal transferred through a read data enable line. The seventh gate element is driven to open or closed by a select signal transferred through a read word line during a read operation.

The first and fourth gate elements are driven to open or closed in response to a select signal transferred through a write word line during a write operation, respectively. The second and third gate elements are driven to open or closed in response to data signals transferred through a pair of write data lines during a write operation, respectively.

During a write operation, while keeping the first and fourth gate elements and one of the second and third gate elements closed, a data value to be stored is written in the latch circuit through one of the pair of write data lines.

During a read operation, while keeping the sixth and seventh gate elements closed, a stored data in the latch circuit is read out through the read data line.

With the semiconductor memory circuit of the present invention, in the case that a given data value is written in a selected one of the memory cells, one of the second and third gate elements of this selected memory cell is closed while the first and fourth gate elements of the selected memory cell are kept closed.

Therefore, unselected memory cells are not written in because the first and fourth gate elements of the remaining memory cells are open through the pairs of the write data lines, respectively. This means that power dissipation during the write operation is reduced compared with the conventional one.

In the case that a desired data value stored in a selected one of memory cells is read out, the sixth and seventh gate elements of this selected memory cell are closed.

Therefore, unselected memory cells are prevented from being read out by keeping the sixth gate elements of the remaining memory cells open through the read data enable lines, respectively. This means that power dissipation during the read operation is reduced compared with the conventional one.

DETAILED DESCRIPTION OF THE PREFERRED EMBODIMENT

Next, preferred embodiments of the present invention will be described below referring to FIGS. 3 to 5.

FIRST EMBODIMENT

Figure 3:
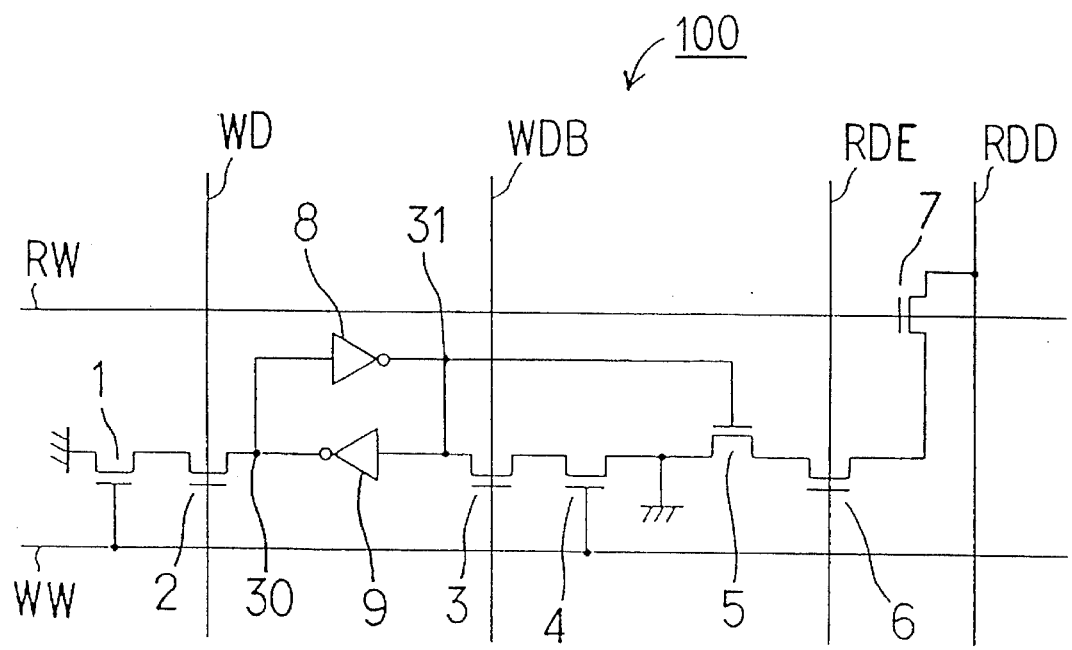
FIG. 3 is a circuit diagram of a dual-port RAM according to a first embodiment of the invention.

A memory cell 100 of a dual-port RAM having an exclusive port for a reading operation and that for a writing operation according to a first embodiment of the invention is shown in FIG. 3.

The memory cell 100 has a read word line RW, a write word line WW, a pair of write data lines WD and WDB, a read data enable line RDE, and a read data line RDD. The single-bit memory cell 100 is deposited at an intersection of the lines RW, WW, WD, WDB, RDE and RDD.

The memory cell 100 contains a data latch circuit composed of a pair of inverters 8 and 9, and seven N-channel MOS transistors 1, 2, 3, 4, 5, 6 and 7 as gate elements for controlling data input and output operations to the latch circuit.

The input end of the inverter 8 and the output end of the inverter 9 are connected in common to a connection point 30 and the input end of the inverter 9 and the output end of the inverter 8 are connected in common to a connection point 31.

The gate elements 1 and 2 connected in series are placed between the connection point 30 and a reference point or the ground. The gate elements 3 and 4 connected in series are placed between the connection point 31 and the reference point or at ground potential. The gate elements 5, 6 and 7 connected in series are placed between the connection point 31 and a read data line RDD.

The control terminal of the first and fourth gate elements 1 and 4 are connected to a write word line WW. The control terminal of the second gate element 2 is connected to the write data line WD and the control terminal of the third gate element 3 is connected to the write data line WDB.

The control terminal of the fifth gate element 5 is connected to the connection point 31, the control terminal of the sixth gate element 6 is connected to the read data line RDD, and the control terminal of the seventh gate element 7 is connected to the read word line RDD.

Figure 4:
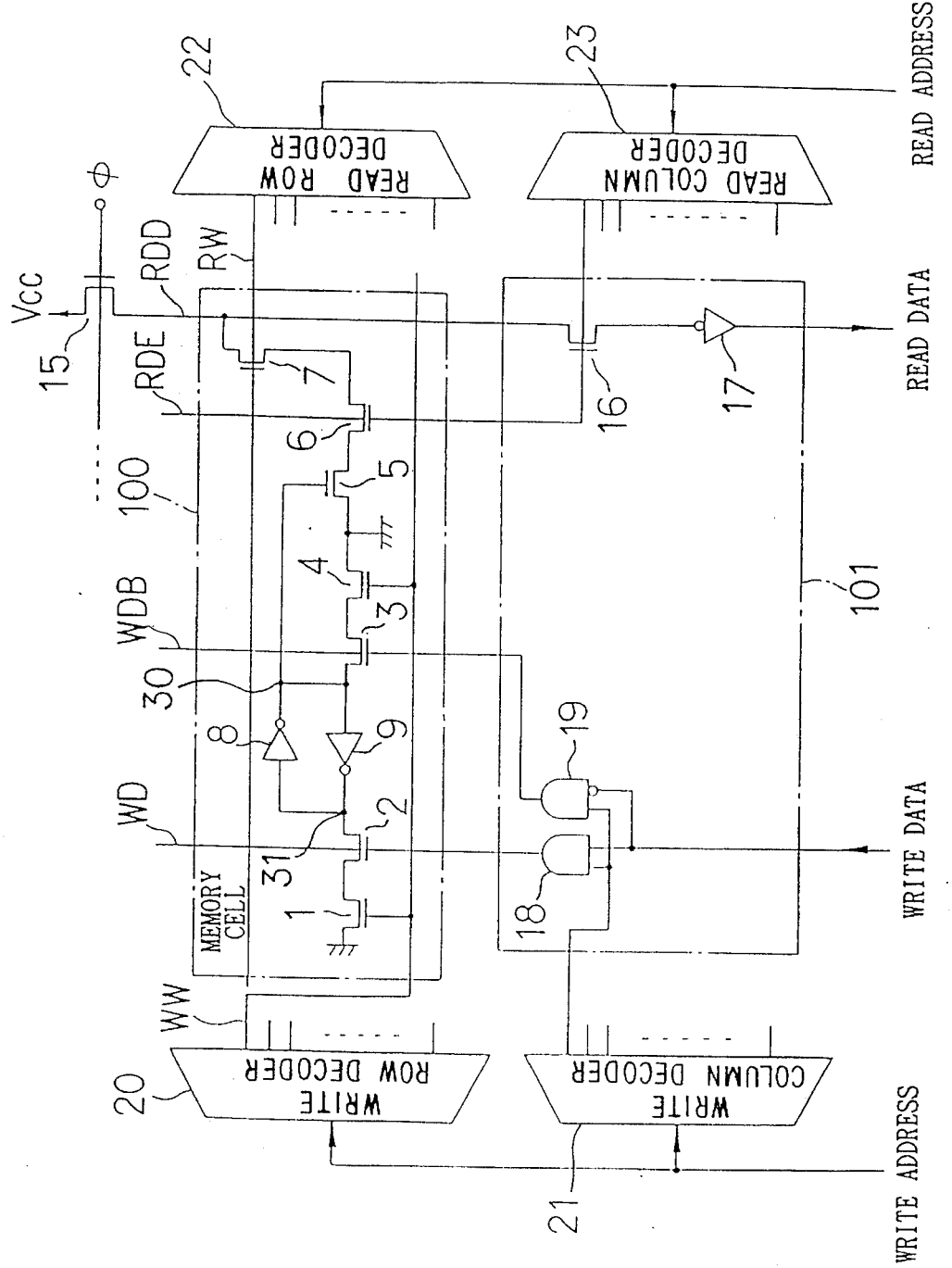
FIG. 4 is a schematic block diagram showing the entire structure of the RAM of the first embodiment.

The entire architecture of the dual-port RAM of the first embodiment is shown in FIG. 4.

Figure 1:
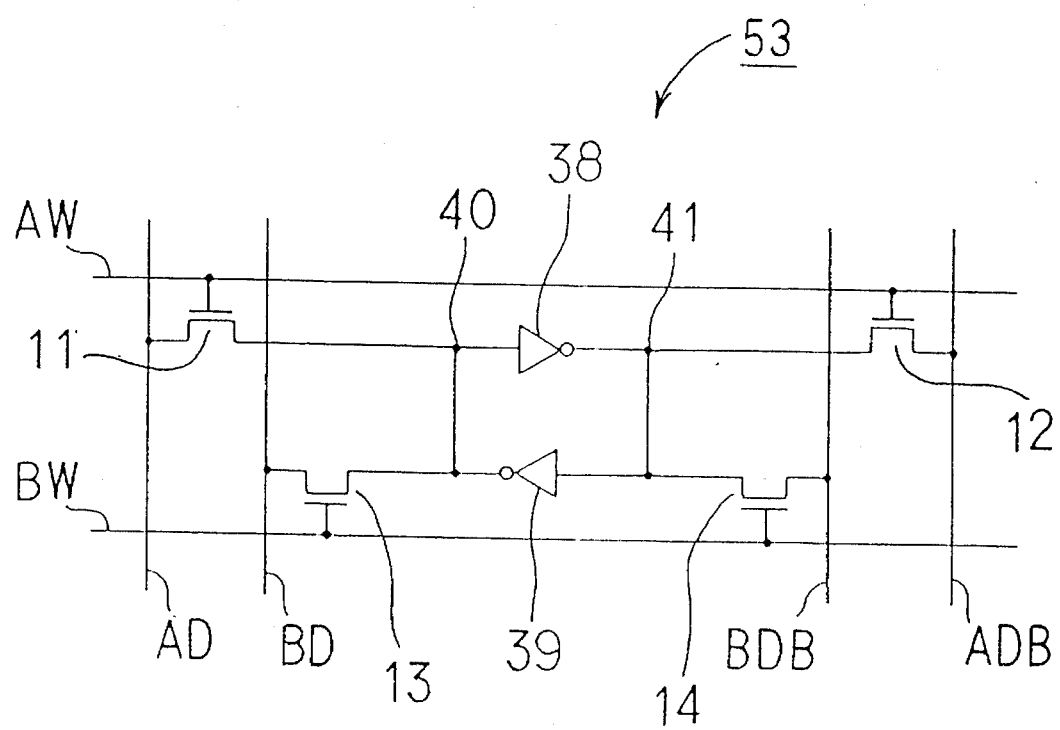
FIG. 1 is a circuit diagram of a dual-port memory cell of a conventional RAM.
Figure 2:
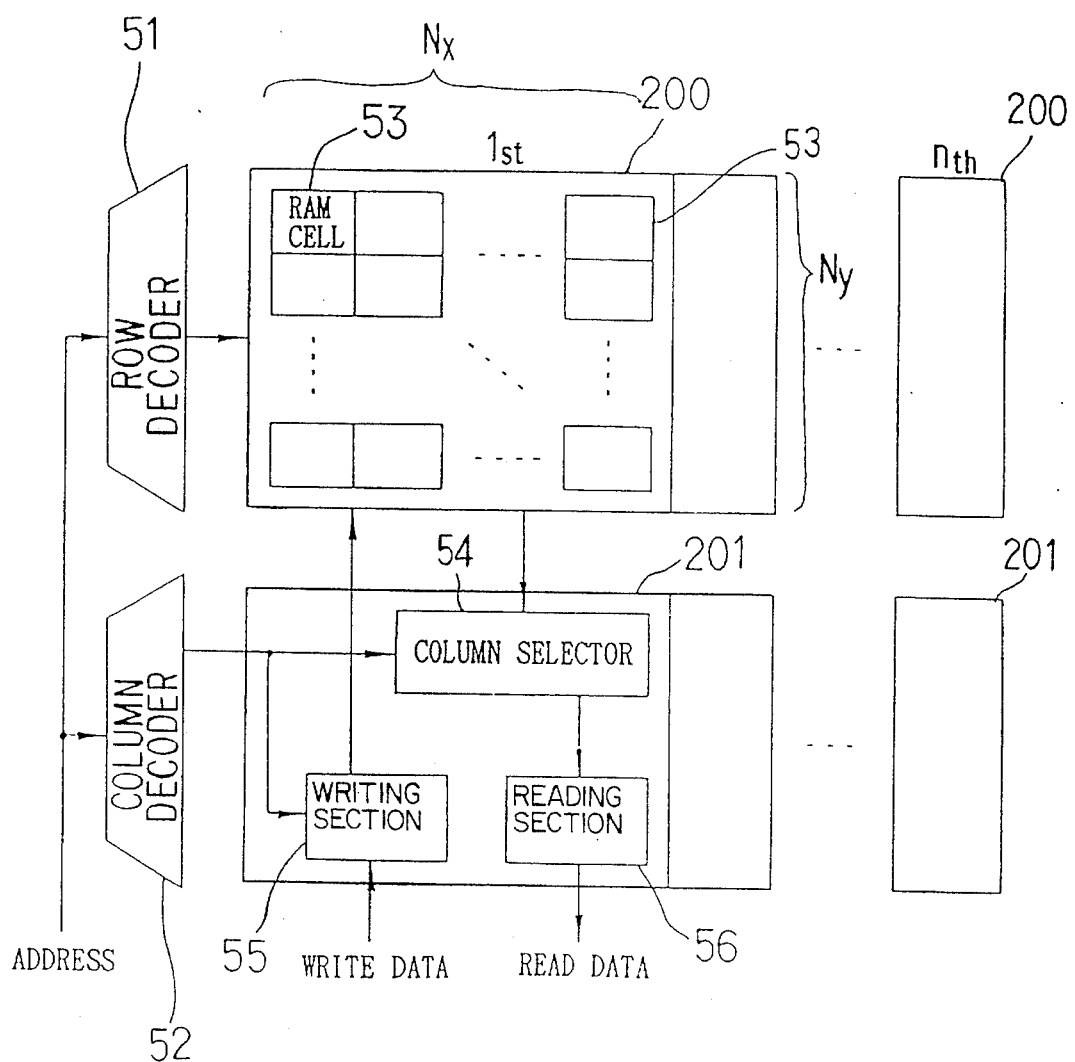
FIG. 2 is a schematic block diagram showing the entire structure of the conventional RAM.

In this RAM, similar to the conventional one shown in FIG. 2, $N_x$ memory cells 100 are arranged horizontally and $N_y$ memory cells 100 are arranged vertically, resulting in an $N_x \times N_y$ matrix array of the cells 100. First to nth matrix arrays of the memory cells 100 are aligned horizontally. Therefore, this RAM can store information of n bits x ($N_x \times N_y$) words.

However, only one of the cells 100 is shown in FIG. 4 for the sake of simplification of description.

First to nth data input/output sections 101 are provided for the first to nth memory cell arrays, respectively. However, only one of the sections 101 is shown in FIG. 4 for the sake of simplification of description.

The write data lines WD of all the memory cells 100 contained in each column of the memory cell matrix are connected in common and the write data lines WDB thereof are connected in common. Similarly, the read data enable lines RDE of all the memory cells 100 contained in each column of the memory cell matrix are connected in common and the read data lines RDD thereof are connected in common.

The read word lines RW of all the memory cells 100 contained in each row of the memory cell matrix are connected in common and the write word lines WW thereof are connected in common.

A rite row decoder 20 receives a write address signal and outputs a row select signal to the common-connected write word lines WW of all the memory cells 100 during a write operation.

A read row decoder 22 receives a read address signal and outputs a row select signal to the common-connected read word lines RW of all the memory cells 100 during a read operation.

A write column decoder 21 receives the write address signal and outputs a row select signal to the first input ends of a pair of two-input AND gates 18 and 19 acting as a data writing section in the input/output section 101, respectively. A data value to be stored is inputted to the second input ends of the pair of gates 18 and 19. The data value to be stored is directly inputted to AND gate 18, but is inputted to AND gate 19 after logic state inversion.

Thus, the data value to be stored is distributed to the AND gates 18 and 19 in complementary logic states, respectively. The data value to be stored is further inputted to the pair of the common-connected write word lines WD and WDB in complementary logic states, respectively.

A read column decoder 23 receives the read address signal and outputs a column select signal to a column selector 16 composed of an N-channel MOS transistor or a gate element 16. The gate element 16 is connected to the common-connected read data lines RDD and is placed between a sense circuit 17 composed of an inverter in the data input/output section 101 and a gate element or N-channel MOS transistor 15. The sense circuit 17 acts as a data reading section.

The column selector 16 connects or separates the common-connected read data lines RDD and the sense circuit 17 in response to the column select signal from the read column decoder 23 to output the read data read out from the desired memory cell 100.

The gate element 15 is closed by a clock signal to precharge the read data lines RDD.

Next, the write and read operations of the first embodiment are described below.

During a write operation, the write word line WW of the memory cell 100 to be written is driven to a high logic state 1, and one of the pair of the write data lines WD and WDB is driven to a high logic state 1 and the other thereof is driven to a low logic state 0. For example, in the case of writing a high logic state 1 in the cell 100, the write data line WD is driven to a high logic state 1 and the write data line WDB is to a low logic state 0. In the case of writing a low logic state 0 in the cell 100, the write data line WDB is driven to a high logic state 1 and the write data line WD is to a low logic state 0.

When the rite data line WD is a high logic state 1 and the write data line WDB is in a low logic state 0, the gate elements 1, 2 and 4 are closed (ON) and the gate element 3 is open (OFF). Therefore, the input and output of inverter 8 becomes low and high logic states 0 and 1, respectively, and as a result, a data value of a high logic level 1 is stored in the latch circuit.

This data value thus stored is maintained even if the write word line WW changes to a low logic state 0 and the gate elements 1 and 4 become open (OFF).

When the write data line WDB is a high logic state 1 and the write data line WD is in a low logic state 0, a data value of an inverted state, i.e., a low logic level 0, is stored in the latch circuit in the similar way.

During a read operation, one of the read word lines RW and the read data enable line RDE of the memory cell 100 to be read out is driven to a low logic state 0 to make the gate element 6 or 7 open (OFF). Then, the read data line RDD is precharged to a high logic state 1 by the gate element 15 driven by the clock signal.

Subsequently, the read word line RW and the read data enable line RDE are driven to high logic state 1 to make the gate elements 6 and 7 closed (ON), respectively. At this time, the logic state of the read data line RDD varies according to the data value stored in the latch circuit.

That is, when the output of the inverter 8 is in a high logic state 1, the gate element 5 is closed (ON), so that the read data line RDD precharged to a high logic state 1 in advance is discharged through the gate element 5 to the ground to be a low logic state 0. This means that a data value of a low logic level is read out.

When the output of the inverter 8 is in a low logic state 0, the gate element 5 is open (OFF), so that the read data line RDD precharged to a high logic state 1 in advance is held at the same state or a high logic state 1. This means that a data value of a high logic level is read out.

During a write operation, in the case that the write word line WW is in a low logic state 0, the gate elements 1 and 4 are OFF. Therefore, no data is written in the latch circuit independent of the logic states of the pair of the write data lines WD and WDB. In the case that the write word line WW is in a high logic state 1, the gate elements 1 and 4 are ON. However, if the logic states of the pair of the rite data lines WD and WDB are in low logic states, respectively, the gate elements 2 and 3 are OFF, so that no data is written in the latch circuit.

To prevent the unselected memory cells 100 contained in the row to be write in from being erroneously written, it is sufficient that the logic states of the pair of the write data lines WD and WDB are kept in low logic states, respectively. Therefore, wasteful power dissipation during a write operation, which is a problem in the conventional RAM, can be eliminated.

Also, to not read out the unselected memory cells 100 contained in the row to be read out, it is sufficient that the logic state of the read data enable line RDE is kept in a low logic state to drive the gate element 6 to be OFF. In this case, since the read data line RDD is kept precharged, the unwanted memory cells 100 do not read out. This means that wasteful power dissipation during a read operation, which is a problem in the conventional RAM, is also eliminated.

SECOND EMBODIMENT

Figure 5:
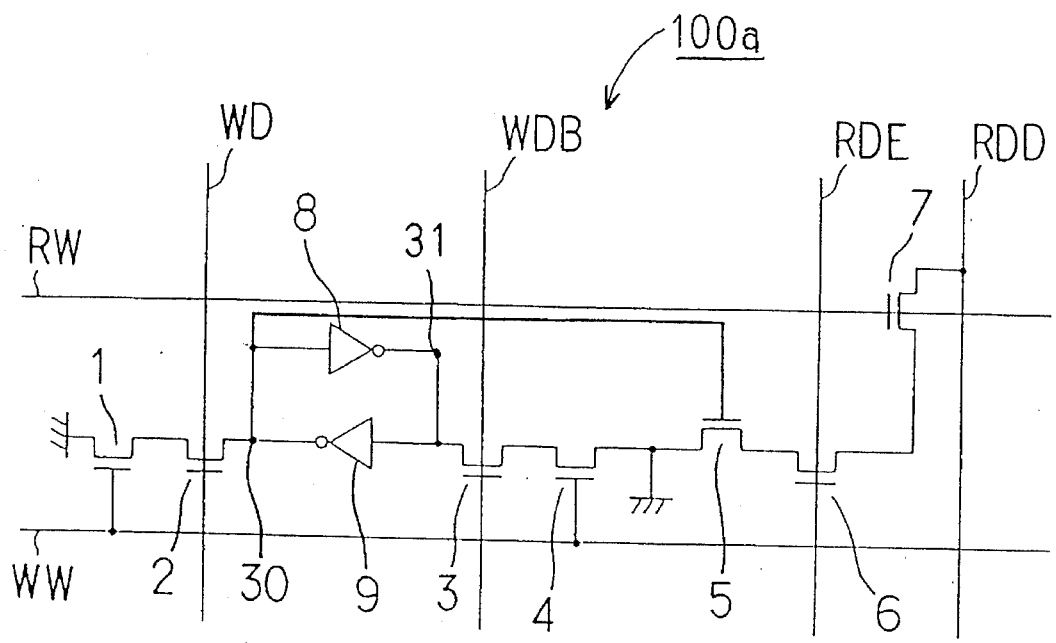
FIG. 5 is a circuit diagram of a dual-port RAM according to a second embodiment of the invention.

A memory cell 100a of a dual-port RAM according to a second embodiment of the invention is shown in FIG. 5.

The memory cell 100a is the same in structure as that of the first embodiment excepting that the control terminal of the gate element 5 is connected to the connection point 30 instead of the connection point 31.

In this embodiment, the gate element 5 is driven to open or closed by the logic state of the connection point 30. The same effects or advantages can be obtained.

In the first and second embodiments, the reference point is at ground potential; however, it may also be an electric potential equal to a power source voltage for the RAM. In addition, P-channel MOS transistors may be used instead of the N-channel ones.

While the preferred forms of the present invention have been described, modifications will be apparent to those skilled in the art without departing from the spirit of the invention. The scope of the invention, therefore, is to be determined solely by the following claims.

What is claimed is:

1. A semiconductor memory circuit having an array of memory cells, each of said memory cells comprising:

a latch circuit formed of first and second inverters, an input end of said first inverter and an output end of said second inverter being connected in common to a first connection point, and an output end of said first inverter and an input end of said second inverter being connected in common to a second connection point;

first and second gate elements connected in series, said first and second gate elements being placed between said first connection point and a reference point having a reference electric potential;

third and fourth gate elements connected in series, said third and forth gate elements being placed between said second connection point and said reference point;

fifth, sixth and seventh gate elements connected in series, said fifth, sixth and seventh gate elements being placed between said reference point and a read data line;

a control terminal of said fifth gate element being connected to said latch circuit through one of said first and second connection points;

said fifth gate element being driven to open or closed according to a data value stored in said latch circuit;

a read data enable line connected to a control terminal of said sixth gate element, said sixth gate element being driven to open or closed in response to a read data enable signal transferred through said read data enable line;

a write word line connected to control terminals of said first and fourth gate elements, said first and fourth gate elements being driven to open or closed in response to a select signal transferred through said write word line during a write operation;

a pair of write data lines through which fata to be stored is written in said latch circuit, one of said pair of write data lines being connected to a control terminal of said second gate element, and the other of said pair being connected to a control terminal of said third gate element;

said second and third gate elements being driven to open or closed in response to data signals transferred through said pair of write data lines during said write operation, respectively; and a read word line connected to a control terminal of said seventh gate element, said seventh gate element being driven to open or closed in response to a read data signal transferred through said read word line during a read operation;

wherein during said write operation, while said first and fourth gate elements and one of said second and third gate elements are driven to closed, said data to be stored is written in said latch circuit through said one of said second and third gate elements which was driven to closed; and during said read operation, while keeping said sixth and seventh gate elements closed, said data value stored in said latch circuit is read out through said read data line.

2. The semiconductor memory circuit as claimed in claim 1, further comprising a precharge means, said precharge means precharging said read data line just before reading said data value stored in said latch circuit.

3. The semiconductor memory circuit as claimed in claim 2, wherein said precharge means contains an eighth gate element driven to be open or closed by a clock signal.

4. The semiconductor memory circuit as claimed in claim 3, wherein each of said read data lines has a ninth gate element driven to be open or closed by a read address signal.

5. The semiconductor memory circuit as claimed in claim 1, wherein said memory cells are arranged in a matrix array of $N_x$ columns and $N_y$ rows, said semiconductor memory circuit further comprising:

a write row decoder for selecting at least one of said rows of said memory cells through said write word line or lines in response to a write address signal during said write operation;

a write column decoder for selecting at least one of said columns of said memory cells through said pair or pairs of said write data lines in response to said write address signal during said write operation;

a read row decoder for selecting at least one of said rows of said memory cells through said read word line or lines in response to a read address signal during said read operation;

a read column decoder for selecting at least one of said columns of said memory cells through said read data enable line or lines in response to said read address signal during said read operation.

6. The semiconductor memory circuit as claimed in claim 5, further comprising a precharge means, said precharge means precharging said read data line or lines selected by said read column decoder just before reading said data value stored in said latch circuit or circuits.

7. The semiconductor memory circuit as claimed in claim 6, wherein said precharge means contains an eighth gate element driven to be open or closed by a clock signal, said eighth gate element being connected to each of said read data lines.

8. The semiconductor memory circuit as claimed in claim 7, wherein each of said read data lines has a ninth gate element driven to be open or closed by said read address signal.

9. The semiconductor memory circuit as claimed in claim 8, wherein said reference point is at ground potential, said first to ninth gate elements are MOS transistors, and a write data is distributed to each of said pairs of write data lines in complementary logic states, respectively.

10. The semiconductor memory circuit as claimed in claim 9, wherein said write data in complementary logic states are produced by a pair of AND gate elements.

* * * * *

UNITED STATES PATENT AND TRADEMARK OFFICE
CERTIFICATE OF CORRECTION

PATENT NO. : 5,493,536
DATED : February 20, 1996
INVENTOR(S) : Yasushi Aoki

It is certified that error appears in the above-indentified patent and that said Letters Patent is hereby corrected as shown below:

Col. 6, line 10, delete "rite", insert --write--.

Col. 6, line 23, before "gates", insert --AND--.

Col. 6, line 61, delete "rite", insert --write--.

Col. 7, line 37, delete "rite", insert --write--.

Signed and Sealed this

Eighteenth Day of June, 1996

Attest:

BRUCE LEHMAN

*Attesting Officer*   *Commissioner of Patents and Trademarks*